United States Patent
Kim et al.

(10) Patent No.: US 8,963,252 B2
(45) Date of Patent: Feb. 24, 2015

(54) SEMICONDUCTOR DEVICE AND METHOD FOR FORMING THE SAME

(75) Inventors: Moojin Kim, Hwaseong-si (KR); Jeongyun Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 68 days.

(21) Appl. No.: 13/618,127

(22) Filed: Sep. 14, 2012

(65) Prior Publication Data

US 2013/0113046 A1   May 9, 2013

(30) Foreign Application Priority Data

Nov. 7, 2011   (KR) .................. 10-2011-0115012

(51) Int. Cl.
*H01L 27/06* (2006.01)
*H01L 27/02* (2006.01)

(52) U.S. Cl.
CPC ........ *H01L 27/0255* (2013.01); *H01L 27/0629* (2013.01)
USPC ........... 257/355; 257/106; 257/199; 257/481; 257/603; 257/356

(58) Field of Classification Search
CPC ............ H01L 27/0255; H01L 27/0629; H01L 29/66106; H01L 29/7808; H01L 29/7821; H01L 29/866; H01L 2924/12035
USPC ................. 257/356, 106, 199, 481, 551, 603, 257/E29.335, E21.356
See application file for complete search history.

(56) References Cited

U.S. PATENT DOCUMENTS

| | | | | |
|---|---|---|---|---|
| 6,013,927 A * | 1/2000 | Bothra et al. | ............. | 257/328 |
| 6,277,708 B1 | 8/2001 | Bothra et al. | | |
| 6,329,691 B1 * | 12/2001 | Finzi | ............. | 257/355 |
| 6,717,209 B1 | 4/2004 | Kim et al. | | |
| 7,432,556 B2 * | 10/2008 | Eriguchi et al. | ............. | 257/356 |
| 2005/0238076 A1 * | 10/2005 | Kuwata et al. | ............. | 372/50.1 |
| 2006/0273397 A1 * | 12/2006 | Adkisson et al. | ............. | 257/355 |

FOREIGN PATENT DOCUMENTS

KR   100815956 B1   3/2008

OTHER PUBLICATIONS

H.C. Shin et al., "Thin gate oxide damage due to plasma processing," Topical Review, Department of Electrical Engineering and Computer Sciences, University of California at Berkeley, CA 94720, Oct. 18, 1995.

* cited by examiner

*Primary Examiner* — Long K Tran
*Assistant Examiner* — Jordan Klein
(74) *Attorney, Agent, or Firm* — Harness, Dickey & Pierce, P.L.C.

(57) ABSTRACT

Semiconductor devices and methods of forming the same are provided. The semiconductor device may include a semiconductor element disposed on a substrate and including an insulating layer and a gate electrode, a doped region having a first conductivity-type on the substrate, a conductive interconnection electrically connected to the gate electrode, and a first contact plug having a second conductivity-type and electrically connecting the conductive interconnection and the doped region to each other and constituting a Zener diode by junction with the doped region.

15 Claims, 8 Drawing Sheets

SEMICONDUCTOR DEVICE AND METHOD FOR FORMING THE SAME

CROSS-REFERENCE TO RELATED APPLICATIONS

This U.S. non-provisional patent application claims priority under 35 USC §119 to Korean Patent Application No. 10-2011-0115012, filed on Nov. 7, 2011, the entire contents of which are incorporated herein by reference.

BACKGROUND OF THE INVENTION

The present inventive concepts relate to semiconductor devices and, more particularly, to semiconductor devices which are capable of mitigating or preventing damage of an insulating layer attributed to accumulation of charges and/or methods of forming the same.

In recent years, the use of mobile devices such as smart phones, tablets PCs, digital cameras, MP3 players, and personal digital assistants (PDAs) is tremendously growing. Various types of semiconductor devices have been mounted on such mobile devices. Under the mobile environment, there are increasing demands for higher capacity and lower power consumption. In order to meet the demands, the integration of the above-mentioned semiconductor devices continues to increase.

A transistor is the most basic element in semiconductor fabrication processes. In the semiconductor fabrication processes, a plasma process is used as an etching process. As the plasma process is carried out, a large number of charges may be accumulated at a gate electrode of a transistor. The accumulated charges may cause an insulating layer of the transistor to be damaged. A protection circuit may be configured to discharge the accumulated charges. However, a relatively large chip area and an additional process are required to configure the protection circuit.

SUMMARY OF THE INVENTION

Example embodiments of the inventive concepts provide semiconductor devices and/or methods for forming the same.

According to an example embodiment, the semiconductor device may include a semiconductor element on a substrate including an insulating layer and a gate electrode, a doped region having a first conductivity-type on the substrate, a conductive interconnection electrically connected to the gate electrode, and a first contact plug having a second conductivity-type, which electrically connects the conductive interconnection and the doped region to each other and constitutes a Zener diode at a junction with the doped region.

The first conductivity-type may be high-concentration P-type, and the second conductivity-type may be high-concentration N-type.

The semiconductor device may further comprise a second contact plug connecting the gate electrode and the conductive interconnection to each other.

The first and second contact plugs may be formed in the same process for forming a plug.

The doped region may be in a first region, which is apart from a second region in which the semiconductor element is disposed.

The doped region may have substantially the same concentration as a source/drain of the semiconductor element.

Doping concentrations of the first contact plug and the doped region may be determined such that a breakdown voltage of the Zener diode is in the range of about 3.5 to 10 volt.

A junction surface of the Zener diode may be determined by a cross-sectional area of the first contact plug.

According to an example embodiment, the method for forming a semiconductor device may include forming a first conductivity-type heavily doped region on a substrate, forming a semiconductor element including a gate insulating layer and a gate electrode on the substrate, forming second conductivity-type contact plugs on the doped region and the gate electrode, respectively, and forming an interconnection to electrically connecting the second conductivity-type contact plugs to each other.

The contact plugs may include high-concentration dopants.

The doped region may be formed in a first region and the semiconductor element may be formed in a second region spaced apart from the first region.

The interconnection may include at least one metal line.

The first conductivity-type may be P-type and the second conductivity-type may be to N-type.

The first and second conductivity-type concentrations are determined such that a breakdown voltage of a diode element formed at a junction surface of the doped region and one of the contact plugs is in the range of about 3.5 to 10 volt.

According to an example embodiment, a semiconductor device may include a semiconductor element on a substrate, a doped region on the substrate and having a first conductivity-type, and a doped element on the substrate and having a second conductivity-type on the substrate, the doped element contacting the doped region to form a Zener diode and electrically connected to the semiconductor element.

The first conductivity-type may be P-type, and the second conductivity-type may be N-type.

Doping concentrations of the doped element and the doped region may be such that a breakdown voltage of the Zener diode is in the range of about 3.5 to 10 volt.

The semiconductor device may further include a conductive line between the semiconductor element and the doped element. The conductive line may include a metal.

BRIEF DESCRIPTION OF THE DRAWINGS

Example embodiments of the inventive concepts will be more clearly understood from the following brief description taken in conjunction with the accompanying drawings. FIGS. 1-10 represent non-limiting, example embodiments as described herein.

FIG. 1 briefly illustrates a semiconductor fabrication process using plasma according to an example embodiment of the inventive concepts.

FIG. 2 is a cross-sectional view of a protection circuit according to an example embodiment of the inventive concepts.

FIG. 5 is a graphic diagram illustrating current-voltage characteristics of a protection diode according to an example embodiment of the inventive concepts.

FIG. 6 is a block diagram of a memory system according to an example embodiment of the inventive concepts.

FIG. 7 is a block diagram of a computing system including a semiconductor device according to an example embodiment of the inventive concepts.

Figure 1:
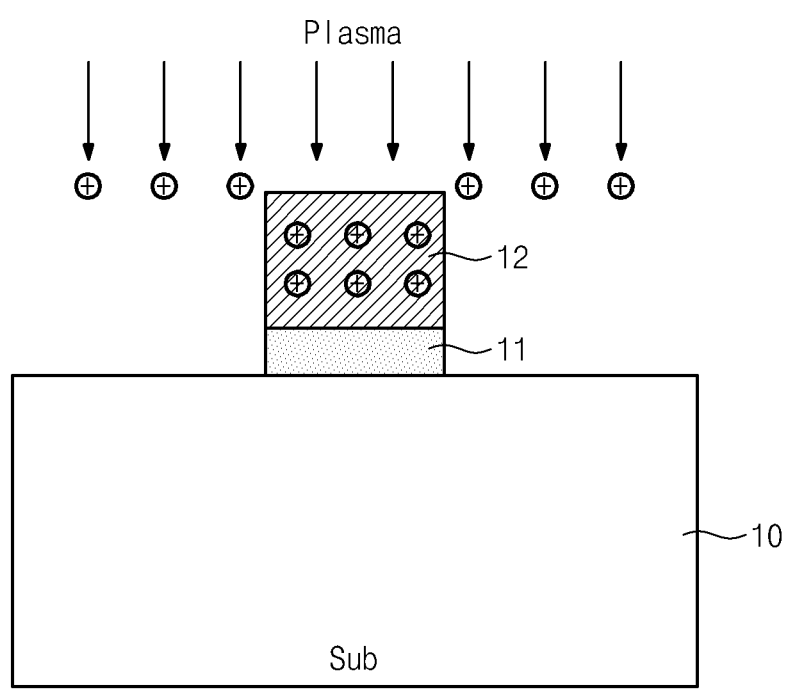

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Below, a memory device is used as an example for illustrating characteristics and functions of the inventive concepts. However, those skilled in the art can easily understand other advantages and performances of the inventive concepts according to the descriptions. The inventive concepts may be embodied or applied through other embodiments. Besides, the detailed description may be amended or modified according to viewpoints and applications, not being out of the scope, technical idea and other objects of the inventive concepts.

FIG. 1 briefly illustrates a semiconductor fabrication process using plasma according to an example embodiment. Referring to FIG. 1, if a plasma process is applied, charges may be accumulated at, for example, a gate of a semiconductor device, e.g., a transistor.

The plasma process has been mainly used to deposit and/or etch various material layers in a semiconductor fabrication process. In addition, the plasma process has been used to treat metal or polymer surfaces or to form new material composition. Accordingly, the plasma process has replaced a conventional process due to needs for lower temperature and/or higher-resolution process features. Applications of materials or environments that can be provided only by plasma processes are increasingly expanding.

However, plasma causes damage and/or degradation of structures during a semiconductor fabrication process. It is known that plasma damage is caused by plasma ions or extreme ultraviolet radiation. For example, it is generally known that charge accumulation by ions is a main cause of degradation of an insulating layer.

Referring again to FIG. 1, before a substrate 10 is loaded, plasma inside a chamber is electrically neutral (i.e., the number of electrons is nearly equal to that of cations). However, when the substrate 10 is loaded into the chamber and placed in the plasma, negative charges (−) and positive charges (+) are generated and accumulated at a previously formed element. The charges generated by the plasma may be accumulated at, for example, a gate electrode 12 of the elements. If the number of the charges accumulated at the gate electrode 12 increases, it may have an effect on characteristics of a gate insulating layer 11 formed below a gate. Unintentional degradation in characteristics of the gate insulating layer 11 may deteriorate reliability of a semiconductor device and increase costs. Accordingly, a protection circuit capable of bypassing the charges accumulated at the gate electrode to the side of the substrate 10 is desirable to protect the gate insulating layer during a plasma process.

Such a protection circuit is required by not only semiconductor devices each including an insulating layer but also all the devices which may be degraded by accumulation of charges.

Figure 2:
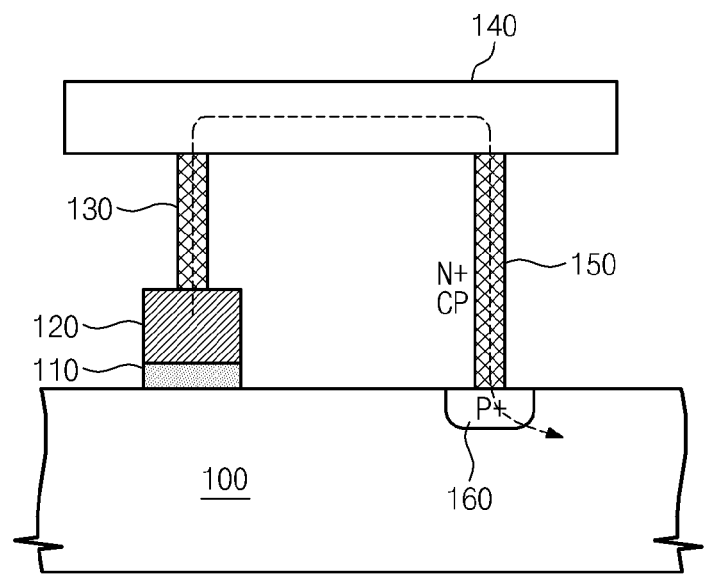

FIG. 2 is a cross-sectional view briefly illustrating the configuration of a protection circuit according to an example embodiment of the inventive concepts. Referring to FIG. 2, a heavily P+-doped region 160 locally doped on a silicon surface and a contact plug 150 made of heavily doped N+ polysilicon in contact with the P+-doped region 160 are provided. The protection circuit may include contact plugs 130 and 150, an interconnection 140, and a P+-doped region 160.

A semiconductor element (e.g., transistor) disposed on a substrate 100 may include a gate insulating layer 110 and a gate electrode 120. The gate electrode 120 may be electrically connected to the interconnection 140 through the contact plug 130. The interconnection 140 may be metal lines disposed at a metal layer. The interconnection 140 may extend from a transistor (TR) area to a protection area in which the protection circuit is disposed. Although it is shown that the interconnection 140 is one metal line, the interconnection 140 may be a combination of interconnections disposed at a plurality of layers.

In the protection area, the interconnection 140 may be connected to the heavily P+-doped region 160 through the N+ contact plug 150 heavily doped with N-type dopants. The N+ contact plug 150 may be disposed to be perpendicular to the heavily P+-doped region 160. A PN junction diode is formed at a contact surface between the P+-doped region 160 and the N+ contact plug 150. Hereinafter, the above PN junction will be referred to as a protection diode. The connection between the P+-doped region 160 and the N+ contact plug 150 may allow the protection circuit to have characteristics of a Zener diode having a relatively low breakdown voltage.

Charges accumulated at the gate electrode 120 may be discharged to the substrate 100 according to breakdown of a protection diode formed by a heavily doped PN junction. Thus, a voltage stress applied to the gate insulating layer 110 by the accumulated charges may be rapidly relieved.

The P+-doped region 160 may be formed in a doping process for forming a source/drain region of a transistor, and the N+ contact plug 150 may be formed in a process for forming a heavily doped N+ contact plug at a source/drain of the transistor. Similarly, the N+ contact plug 130 may also be formed during the formation of the source/drain of the transistor. Thus, according to example embodiments, a protection diode may be formed during formation of a source/drain in a device area and a contact with the source/drain without formation of an additional mask or pattern.

In addition, concentrations of the N+ contact plug 150 and the P+-doped region 160 for forming the Zener diode may be determined such that a breakdown voltage is in the range of about 3.5 to 10 volt. The Zener diode formed by the protection circuit must be capable of blocking a high voltage Vpp which may be applied to the gate electrode 120 of the semiconductor device. A breakdown voltage of the Zener diode may be set lower than, for example, 10 volt to bypass the charges accumulated at the gate electrode 120 at high speed.

FIGS. 3A to 3D are cross-sectional views illustrating a procedure of forming a protection circuit according to an example embodiment of the inventive concepts. A method for forming a protection circuit according to one example embodiment of the inventive concepts will now be described below with reference to FIGS. 3A to 3D.

Figure 3A:
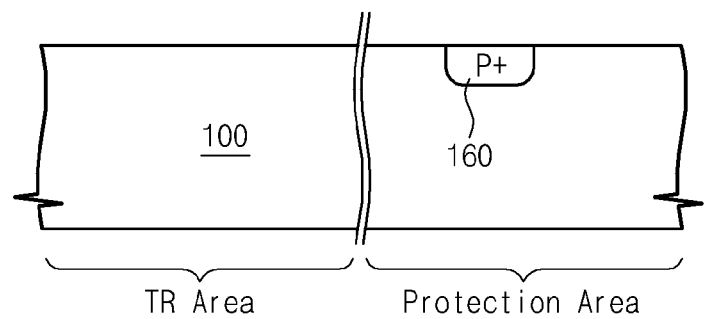
FIGS. 3A to 3D are cross-sectional views illustrating a procedure of forming a protection circuit according to an example embodiment of the inventive concepts.

Referring to FIG. 3A, a P+-doped region 160 formed in a protection area on a substrate 100 is shown. Although it is shown that the P+-doped region 160 may be formed in the protection area, the inventive concepts is not limited thereto. For example, the P+-doped region 160 may be formed in a device formation area (e.g., TR area), but not in a separate area. Additionally, although it is shown in FIG. 3A that the P+-doped region 160 may be formed separately, the P+-doped region 160 may be formed during a doping process for forming a source/drain of a transistor.

Figure 3B:
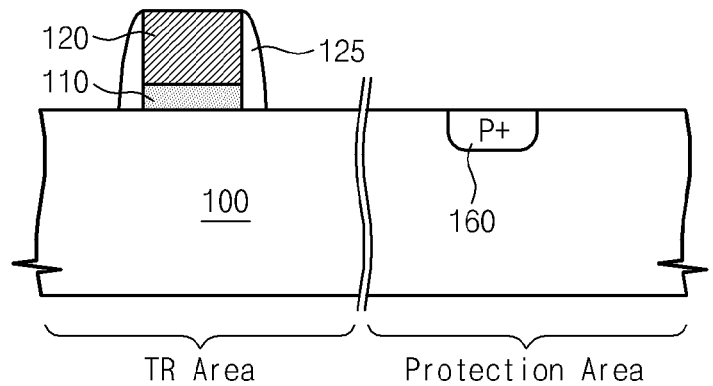

Referring to FIG. 3B, a transistor is formed. A gate insulating layer 110 and a gate electrode 120 may be sequentially stacked on the substrate 100. The gate insulating layer 110 may be formed of oxide, nitride or a stacked layer thereof. The gate insulating layer 110 may be formed of metal oxide having a high dielectric constant, a stacked layer thereof in a laminate structure or a mixed layer thereof. The metal oxide may be aluminum oxide ($Al_2O_3$), hafnium oxide ($HfO_2$) or zirconium oxide ($ZrO_2$) having a dielectric constant of about 9 or more. The gate electrode 120 may be formed of polysilicon doped with impurities (e.g., P, As, B or the like) or metal.

Next, a spacer 125 may be formed on both sidewalls of the gate insulating layer 110 and the gate electrode 120. The spacer 125 may be formed of oxide or nitride and act as a protection layer for protecting the gate insulating layer 110 and the gate electrode 120.

After the spacer 125 is formed, an ion implantation process may be performed to form junction areas (not shown) for forming a source/drain having constant depth at opposite sides of the gate electrode 120 adjacent to the spacer 125. The junction areas may be formed by heavily doping P-type dopants or N-type dopants. If the P-type dopants are heavily doped in the junction areas, a P+-doped region 160 may be formed by means of ion implantation during the formation of the junction area for forming the source/drain of the transistor.

Figure 3C:
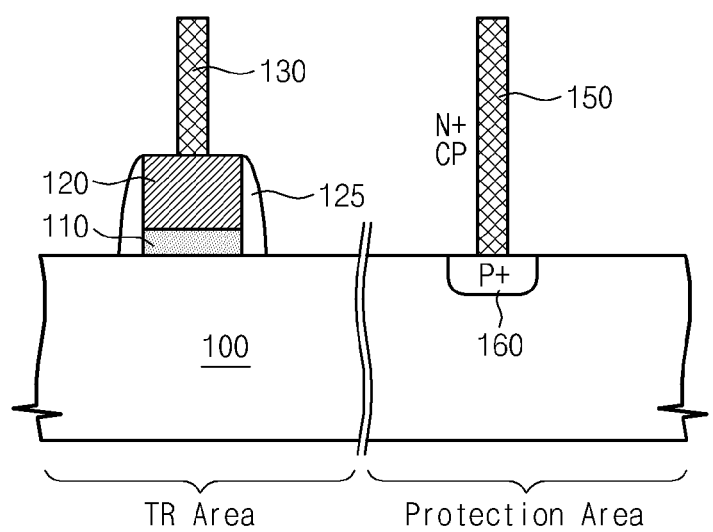

Referring to FIG. 3C, an N+ contact plug 130 may be formed on the gate electrode 120. Additionally, an N+ contact plug 150 may be formed on the P+-doped region 160 in the same process as the formation of the N+ contact plug 130. Photo masking, etching, and deposition processes for forming the N+ contact plugs 130 and 150 may be performed simultaneously. Thus, the N+ contact plug 150 may be formed without using multiple photo masking or etching processes.

Figure 3D:
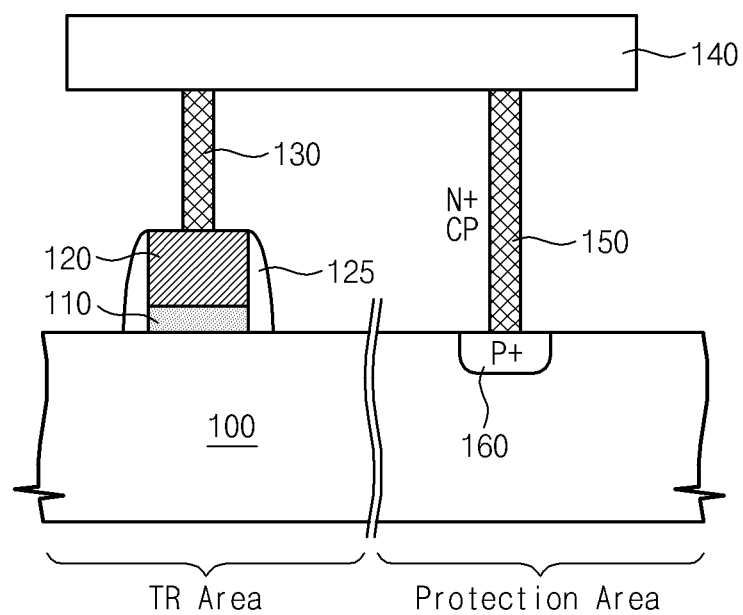

FIG. 3D illustrates a method of forming an interconnection 140 connecting the N+ contact plugs 130 and 150 to each other. Although it is described herein that the interconnection 140 may be formed at one metal layer, it will be understood that the inventive concepts are not limited thereto. The N+ contact plugs 130 and 150 may be electrically connected to each other through contact plugs and conductive lines may be formed at a plurality of layers in consideration of the structure of the semiconductor device.

Figure 4A:
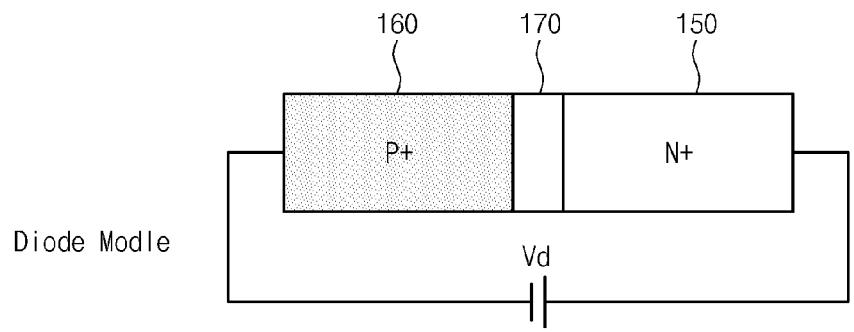
FIGS. 4A to 4C illustrate characteristics of a protection diode according to an example embodiment of the inventive concepts.
Figure 4B:
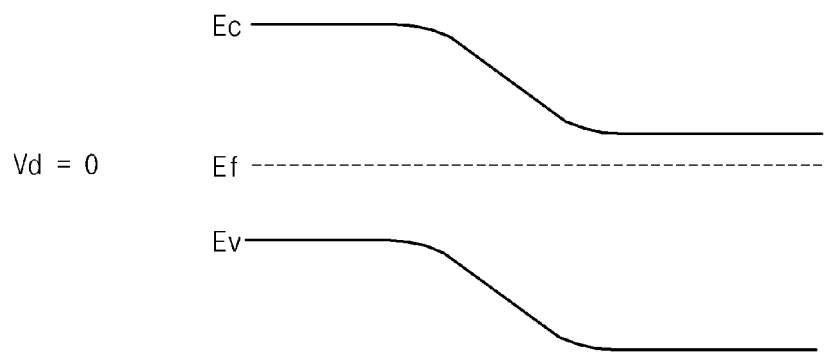
Figure 4C:
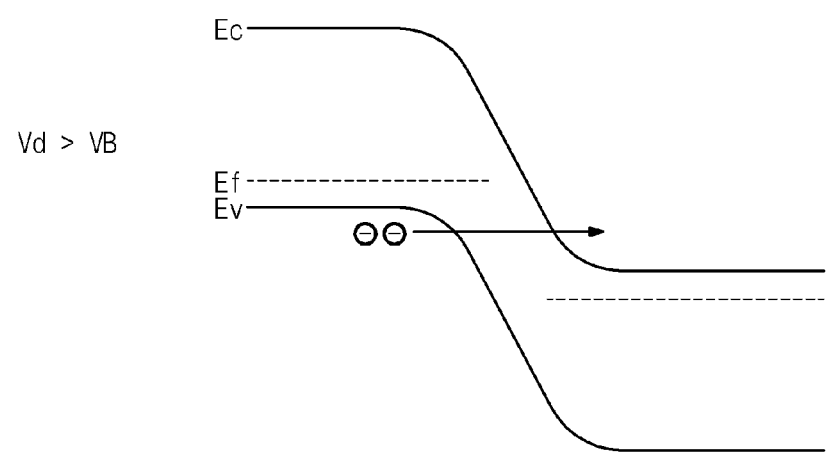

FIGS. 4A to 4C illustrate characteristics of a protection diode formed at a junction surface of the foregoing P+-doped region 160 and the foregoing N+ contact plug 150. Referring to FIG. 4A, a Zener diode may be formed at the junction surface of the P+-doped region 160 and the N+ contact plug 150.

FIG. 4A illustrates a modeling of a PN junction diode a P+-doped region 160 applied with a diode voltage Vd, an N+ contact plug 150, and a depletion region 170 therebetween are shown. The diode voltage Vd corresponds to a voltage difference between the P+-doped region 160 and the N+ contact plug 150. The voltage difference between the P+-doped region 160 and the N+ contact plug 150 may be due to charges (e.g., positive charges) accumulated at the gate electrode 120.

In the case that positive charges are accumulated at the gate electrode 120, a positive voltage may be supplied as a diode voltage Vd through the interconnection 140 and the N+ contact plugs 130 and 150 that are formed of conductive materials. As the number of the positive charges accumulated at the gate electrode 120 increases, the magnitude of the diode voltage Vd applied in a reverse direction may increase significantly.

FIG. 4B shows an energy band diagram of the P+/N+ junction diode while a diode voltage Vd is 0 volt. When a bias voltage is not applied at the heavily doped P+/N+ junction diode, a conduction band energy level (Ec), a valence band energy level (Ev), and a Fermi level (ED may have the forms shown in this figure. While a bias is not applied, the Fermi level (ED may have the same value at its both sides, as shown in this figure.

FIG. 4C shows an energy band diagram when a diode voltage Vd becomes lower than a breakdown voltage VB. For example, FIG. 4C shows an energy level when an absolute value of the diode voltage Vd applied in a reverse direction becomes greater than an absolute value of the breakdown voltage VB. In this case, a Fermi level (ED in the P+-doped region 160 and a Fermi level (ED at the N+ contact plug 150 are made different from each other.

At this point, a reverse bias voltage may increase to establish a very high electric field in the depletion region 170. Due to the high-intensity electric field, an energy band of the depletion region 170 may be significantly bent. Accordingly, as the energy band of the depletion region 170 becomes thinner, charges may migrate from one band to another (band-to-band tunneling) with ease. Thus, if the absolute value of the reverse voltage, i.e., the diode voltage Vd, becomes higher than the absolute value of the breakdown voltage VB, large current (breakdown current) may flow. This phenomenon is similar to Zener breakdown which occurs when both the concentrations of P-type impurities and N-type impurities are high. It is indicated that electrons of the valence band (Ev) in the P+-doped region 160 may directly jump to the conduction band (Ec) of the N+ contact plug 150 through an energy barrier.

So far, the characteristics of the Zener diode formed by the P+-doped region 160 and the N+ contact plug 150 have been briefly described. Due to the formation of the P+-doped region 160 and the formation of the N+ contact plug 150 on the P+-doped region 160, a Zener diode may be configured to have a relatively low breakdown voltage. Moreover, although an area occupied by the P+-doped region 160 may be small, the concentration of carriers may be significantly increased through high-concentration ion injection during occurrence of breakdown. Accordingly, because an upper limit of current that may be bypassed is high even if the amount of accumulated charges is great, the accumulated charges may be rapidly removed.

Figure 5:
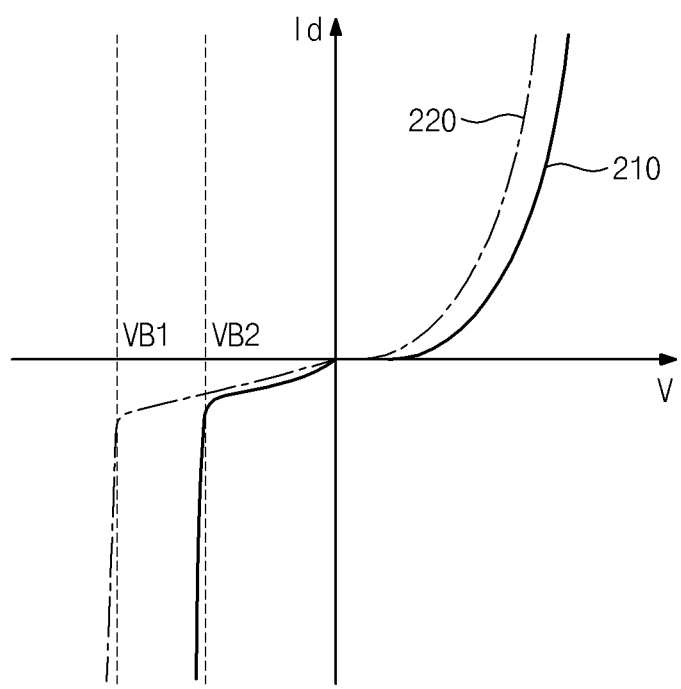

FIG. 5 is a graphic diagram illustrating characteristics of a protection diode according to an example embodiment of the inventive concepts. FIG. 5 shows a current-voltage (I-V) characteristics of a protection diode formed at a junction surface of a first conductivity-type doped region 160 and a second conductivity-type contact plug 150. In FIG. 5, a curve 210 represents a characteristic curve of a protection curve formed by heavy doping (P+/N+ doping), and a curve 220 represents a characteristic curve of a diode formed by typical doping (e.g., doping N+-type dopants in a P-well).

During a forward bias, the characteristic curves 210 and 220 may not be significantly different from each other. A Zener diode according to the inventive concepts may exhibit characteristics that are similar to a typical diode, except that a threshold voltage of the Zener diode may be slightly higher than the typical diode. However, during an operation under a reverse bias, the Zener diode according to the inventive concepts may exhibit a significantly different characteristic from the typical diode.

The Zener diode according to one example embodiment of the inventive concepts may exhibit a breakdown characteristic at a breakdown voltage VB2. However, a typical diode may exhibit a breakdown characteristic at a voltage VB1 lower than the breakdown voltage VB2. This is a characteristic that contributes to a performance of a protection circuit. When the Zener diode according to the inventive concepts is formed, charges accumulated at a gate electrode (120 in FIG. 2) may be removed more rapidly. In addition, because a heavily doped contact surface of the Zener diode allows the large number of charges to migrate in a small area, the number of charges that may migrate at the same time may increase significantly. Accordingly, the amount of charges that may be removed may increase significantly through the protection circuit.

According to the characteristic curve 220 of the diode formed by a typical doping procedure, the breakdown voltage VB1 is lower than the breakdown voltage VB2 of the Zener diode according to the inventive concepts. This means that breakdown of the typical diode starts when the density of electrons accumulated at a gate electrode becomes much higher. Thus, the protection performance of a gate insulating layer of the typical diode may be relatively inferior to that of the Zener diode according to the inventive concepts.

Figure 6:
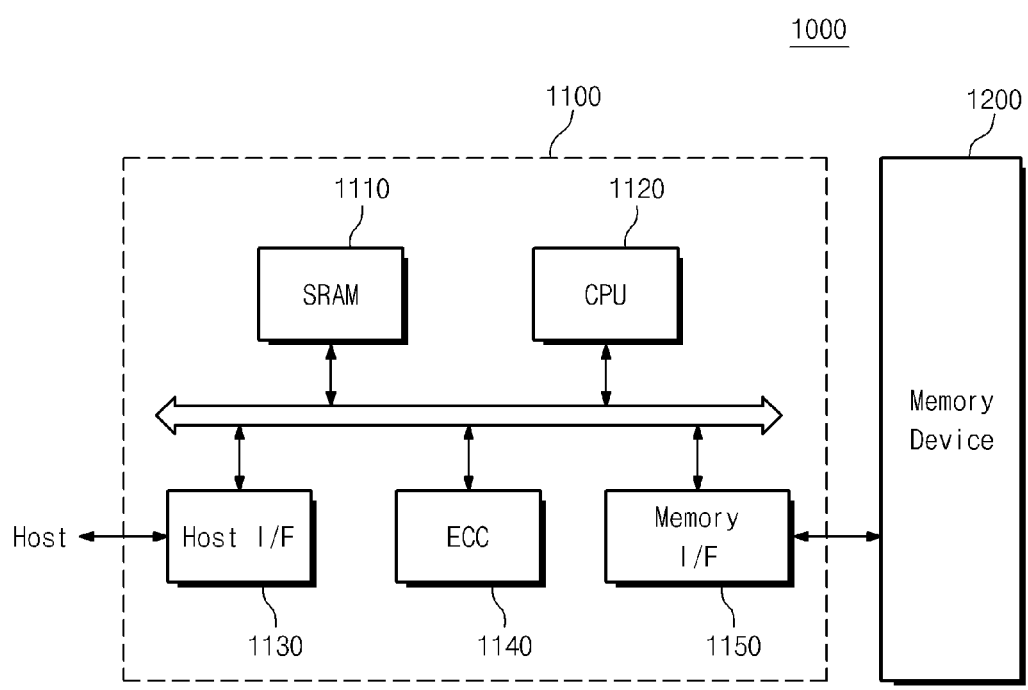

FIG. 6 is a block diagram of a memory system 1000 according to an embodiment of the inventive concepts. Referring to FIG. 6, the memory system 1000 includes a memory controller 1100 and a memory device 1200.

The memory controller 1100 may be configured to control the memory device 1200. The memory device 1200 and the memory controller 1100 may be combined to be provided as a memory card. An SRAM 1100 may serve as a working memory for a processing unit 1120. A host interface (Host I/F) 1130 may include a data exchange protocol of a host connected to the memory system 1000. An error code correction block (ECC) 1140 may detect and correct errors in data read from the memory device 1200. A memory interface (Memory I/F) 1150 may interface with the memory device 1200. The processing unit (CPU) 1120 may perform overall control operations for data exchange of the memory controller 1100. Although not shown in the figure, it is apparent to those skilled in the art that the memory system 1000 according to the inventive concepts may be further provided with a ROM (not shown) configured to store code data for interfacing with the host.

The memory controller 1100 may be configured to communicate with an external entity (e.g., host) through one of various interface protocols such as USB, MMC, SAS, SATA, PATA, SCSI, ESDI, and IDE.

A protection circuit according to the inventive concepts may be formed to constitute the above-described memory controller 1100 or memory device 1200. In order to improve integration density, there is a gradually increasing demand for a plasma process. Subsequently, memory devices or insulating layers of transistors may be protected by a protection circuit according to the inventive concepts in a process for fabricating a high-capacity or high-density semiconductor device.

Figure 7:
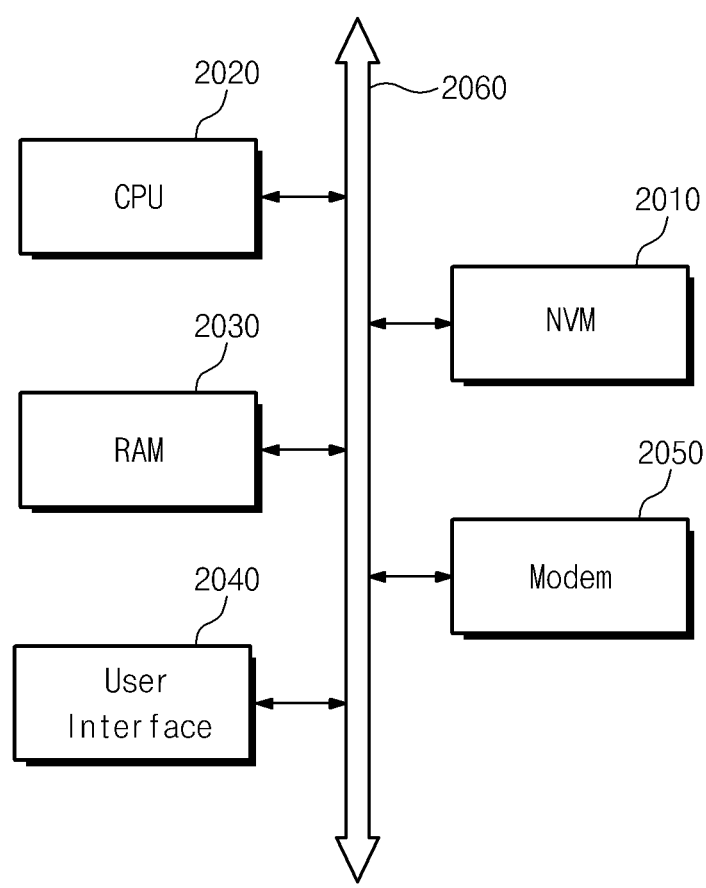

FIG. 7 is a block diagram of a computing system 2000 including a semiconductor device 2010 or a RAM 2030 according to an example embodiment of the inventive concepts. The computing system 2000 includes a central processing unit (CPU) 2020, a RAM 2030, a user interface 2040, a modem 2050 such as a baseband chipset, and a nonvolatile memory 2010, which are electrically connected to a system bus 2060.

In the event that the computing system 2000 is a mobile device, a battery (not shown) may be further provided to supply an operating voltage of the computing system 2000. Although not shown in the figure, it is apparent to those skilled in the art that the computing system 2000 may further include an application chipset, a camera image sensor (CIS), a mobile DRAM, and the like.

A protection circuit according to the inventive concepts may be used to protect devices constituting the above-described nonvolatile memory 2010, processing unit 2020, RAM 2030, user interface 2040, and/or modem 2050. A high-reliability and high-density semiconductor device may be formed with low cost through the protection circuit according to the inventive concepts.

A semiconductor device according to the inventive concepts may be packaged as one of various types to be subsequently embedded. For example, the semiconductor device according to the inventive concepts may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC) Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

According to embodiments of the inventive concepts described above, an insulating layer protection circuit having high-efficiency protection performance can be provided without securing an excessive chip area or performing an additional novel process.

While example embodiments of the inventive concepts have been particularly shown and described, it will be apparent to those of ordinary skill in the art that various changes in form and detail may be made therein without departing from the spirit and scope of the inventive concepts as defined by the following claims.

What is claimed is:

1. A semiconductor device comprising:
   a semiconductor element on a substrate, the semiconductor element including an insulating layer and a gate electrode;
   a doped region having a first conductivity-type on the substrate;
   a conductive interconnection electrically connected to the gate electrode; and
   a first contact plug having a second conductivity-type, the first contact plug electrically connecting the conductive interconnection and the doped region to each other and constituting a Zener diode at a junction with the doped region.

2. The semiconductor device as set forth in claim 1, wherein the first conductivity-type is high-concentration P-type, and the second conductivity-type is high-concentration N-type.

3. The semiconductor device as set forth in claim 1, further comprising:
   a second contact plug connecting the gate electrode and the conductive interconnection to each other.

4. The semiconductor device as set forth in claim 3, wherein the first and second contact plugs are formed in a same process for forming a plug.

5. The semiconductor device as set forth in claim 1, wherein the doped region is in a first region, the first region being apart from a second region in which the semiconductor element is formed.

6. The semiconductor device as set forth in claim 1, wherein the doped region has substantially a same concentration as a source/drain of the semiconductor element.

7. The semiconductor device as set forth in claim 1, wherein doping concentrations of the first contact plug and the doped region are such that a breakdown voltage of the Zener diode is in the range of about 3.5 to 10 volt.

8. The semiconductor device as set forth in claim 1, wherein a junction surface of the Zener diode is determined by a cross-sectional area of the first contact plug.

9. A semiconductor device comprising:
   a semiconductor element on a substrate;
   a doped region on the substrate, the doped region having a first conductivity-type; and
   a doped element projecting from the substrate, the doped element having a second conductivity-type, and the doped element contacting the doped region to form a Zener diode and electrically connected to the semiconductor element, wherein the doped element is connected to a gate electrode of the semiconductor element.

10. The semiconductor device as set forth in claim 9, wherein the first conductivity-type is P-type, and the second conductivity-type is N-type.

11. The semiconductor device as set forth in claim 9, wherein doping concentrations of the doped element and the doped region are such that a breakdown voltage of the Zener diode is in the range of about 3.5 to 10 volt.

12. The semiconductor device as set forth in claim 9, further comprising:
   a conductive line between the semiconductor element and the doped element.

13. The semiconductor device as set forth in claim 12, wherein the conductive line includes at least one metal line.

14. The semiconductor device as set forth in claim 9, wherein the doped element is a contact plug.

15. The semiconductor device as set forth in claim 9, wherein the first conductivity-type is one of high-concentration P-type and high-concentration N-type, and the second conductivity-type is the other one of high-concentration P-type and high-concentration N-type.

\* \* \* \* \*